US012596147B2

(12) United States Patent　(10) Patent No.:　US 12,596,147 B2
Yoshida　(45) **Date of Patent:　\*Apr. 7, 2026**

(54) ALIGNMENT CHIP FOR PROBE CARD, PROBE CARD AND PROBE CARD REPAIR METHOD

(71) Applicant: Japan Electronic Materials Corporation, Hyogo (JP)

(72) Inventor: Takashi Yoshida, Hyogo (JP)

(73) Assignee: JAPAN ELECTRONIC MATERIALS CORPORATION, Hyogo (JP)

( * ) Notice: Subject to any disclaimer, the term of this patent is extended or adjusted under 35 U.S.C. 154(b) by 192 days.

This patent is subject to a terminal disclaimer.

(21) Appl. No.: 18/265,263

(22) PCT Filed: Feb. 19, 2021

(86) PCT No.: PCT/JP2021/006256

§ 371 (c)(1),
(2) Date: Jun. 5, 2023

(87) PCT Pub. No.: WO2022/176143

PCT Pub. Date: Aug. 25, 2022

(65) Prior Publication Data

US 2024/0103071 A1　　Mar. 28, 2024

(51) Int. Cl.
G01R 31/28　　　(2006.01)
G01R 1/073　　　(2006.01)
G01R 3/00　　　(2006.01)
(52) U.S. Cl.
CPC ..... G01R 31/2889 (2013.01); G01R 1/07314 (2013.01); G01R 3/00 (2013.01)

(58) Field of Classification Search
CPC ........................ G01R 1/07314; G01R 31/2889
See application file for complete search history.

(56) References Cited

U.S. PATENT DOCUMENTS

| 6,429,671 | B1 | 8/2002 | Duckworth et al. |
| 6,814,889 | B1 | 11/2004 | O'Grady et al. |
| | | (Continued) | |

FOREIGN PATENT DOCUMENTS

| JP | H0196944 A | 4/1989 |
| JP | H11154694 A | 6/1999 |
| | (Continued) | |

OTHER PUBLICATIONS

Translation of WO97028483A (Year: 1997).*

(Continued)

*Primary Examiner* — Paresh Patel
(74) *Attorney, Agent, or Firm* — Kilyk & Bowersox, P.L.L.C.

(57)　　　　ABSTRACT

An object is to provide an alignment chip for forming an alignment symbol on a wiring board of a probe card. Provided are: a substrate 51 having a pasting surface to be pasted to a probe installation surface 17 of a wiring board 14 constituting a probe card 10 via an adhesive 54; and an alignment symbol 501 made of a metal film 52 formed on a symbol surface on a side opposite to the pasting surface of the substrate 51. The symbol surface includes a symbol peripheral region 502 surrounding the alignment symbol 501, and the symbol peripheral region 502 has a lower reflectance than the alignment symbol 501.

8 Claims, 9 Drawing Sheets

(56) References Cited

U.S. PATENT DOCUMENTS

| 7,589,543 B2 * | 9/2009 | Yamada | .............. | G01R 31/2891 |
| | | | | 324/750.19 |
| 7,649,370 B2 * | 1/2010 | Endou | ................ | G01R 31/2891 |
| | | | | 324/755.11 |
| 2010/0126289 A1 * | 5/2010 | Kinoshita | .......... | G01R 1/07342 |
| | | | | 73/866.5 |
| 2010/0156449 A1 | 6/2010 | Nitta et al. | | |
| 2019/0333782 A1 * | 10/2019 | Wang | ..................... | H01L 25/50 |
| 2020/0174063 A1 | 6/2020 | Huang et al. | | |
| 2024/0044942 A1 * | 2/2024 | Nakamura | ......... | G01R 31/2875 |
| 2024/0110974 A1 * | 4/2024 | Tomita | ................... | G01R 1/073 |

FOREIGN PATENT DOCUMENTS

| JP | 2000346875 A | 12/2000 |
| JP | 2001330626 A | 11/2001 |
| JP | 2007184417 A | 7/2007 |
| JP | 2011117761 A | 6/2011 |
| JP | 2017118138 A | 6/2017 |
| WO | 2022195648 A1 | 9/2022 |

OTHER PUBLICATIONS

International Search Report and Written Opinion issued in corresponding International Patent Application No. PCT/JP2021/006256 (with English translation of International Search Report) mailed May 18, 2021 (11 pages).

* cited by examiner (a) SYMBOL SURFACE (b) A-A CROSS-SECTIONAL VIEW (a)

(a) PLAN VIEW (b) B-B CROSS-SECTIONAL VIEW (a) NORMAL 30
31

(b) ABNORMAL
(FOREIGN MATTER INCLUSION)

30
31
32

(c) ABNORMAL
(SPOT)

33
30
31

(d) ABNORMAL
(SCRATCH)

ALIGNMENT CHIP FOR PROBE CARD, PROBE CARD AND PROBE CARD REPAIR METHOD

This application is a National Stage Application of PCT/JP2021/006256, filed Feb. 19, 2021.

TECHNICAL FIELD

The present invention relates to an alignment chip for a probe card, a probe card, and a probe card repairing method, and more particularly to an alignment chip pasted to a wiring board of a probe card to display an alignment symbol on the wiring board, a probe card including the alignment chip, and a method for repairing the probe card using the alignment chip.

BACKGROUND ART

A probe card is an inspection apparatus used at the time of inspecting electrical characteristics of a semiconductor device formed on a semiconductor wafer, and a large number of probes to be brought into contact with electrode pads on the semiconductor wafer are provided on a wiring board. In addition, an alignment symbol for position alignment is formed on a probe installation surface of the wiring board.

The semiconductor device is inspected by bringing the semiconductor wafer close to the probe card, bringing tips of the probes into contact with the electrode pad on the semiconductor wafer, and causing a current to flow between a tester device to the semiconductor device via the probes and the wiring board. In addition, by capturing an image of the alignment symbol with a camera before the inspection, position alignment (alignment) of the probe card and the semiconductor wafer is performed such that the tips of the probes come into contact with the electrode pad.

FIG. 8 is a view illustrating an example of a wiring board 14 constituting a conventional probe card, and is a view illustrating a state in which a probe installation surface 17 on which probes are installed is viewed in a plan view. A large number of probe electrode pads 15 and four alignment symbols 30 are formed on the probe installation surface 17, and probes 16 are pasted to the respective probe electrode pads 15. The probe 16 is arranged at a position corresponding to an electrode pad of a semiconductor wafer which is an inspection object. Alignment symbols 30 are formed at substantially equal intervals in an outer peripheral edge portion of the wiring board 14.

The probe electrode pad 15 and the alignment symbol 30 are metal films formed on the probe installation surface 17 by photolithography processing using an electroplating method or an etching method. The alignment symbol 30 is made of a metal material having a high reflectance, and is a thin film having a planar shape of a predetermined geometric figure, for example, an Au film having an annular shape.

A symbol peripheral region 31 is a region surrounding the alignment symbol 30 and has a lower reflectance than the alignment symbol 30. Since the reflectance of the alignment symbol 30 and the reflectance of the symbol peripheral region 31 are set to be different from each other, the alignment symbol 30 can be easily identified from the captured image acquired by camera capturing.

In FIG. 9, (a) to (d) are views illustrating various states that may occur in the alignment symbol 30 and the symbol peripheral region 31. In the drawing, (a) illustrates a normal state of the alignment symbol 30. In the drawing, (b) is an example of a case where foreign matter 32 adheres to the symbol peripheral region 31. When a reflectance of the foreign matter 32 is high, there is a possibility that the alignment symbol 30 is not correctly recognizable. In the drawing, (c) is an example of a case where a spot 33 occurs in the symbol peripheral region 31 and a variation in the reflectance occurs in the symbol peripheral region 31. In this case as well, there is a possibility that the alignment symbol 30 is not correctly recognizable. In the drawing, (d) is an example of a case where a scratch 34 occurs in the alignment symbol 30. Since the shape of the alignment symbol changes, there is a possibility that the alignment symbol 30 is not correctly recognizable.

When a defect such as a scratch or dirt is found in the alignment symbol 30 or the symbol peripheral region 31, there is a problem that it is necessary to manufacture the entire wiring board 14 again. Since the alignment symbol 30 is formed on the wiring board 14 by photolithography processing, the alignment symbol 30 in which the defect has been found cannot be repaired. For this reason, if there is a defect in the alignment symbol 30 or the like, it is necessary to discard the wiring board 14 as a defective product even if there is no problem in the probe electrode pad 15, which causes a problem that a yield of the wiring board 14 is decreased.

As a conventional method for forming an alignment symbol, a method using a sheet-like member is proposed (for example, Patent Literature 1). Patent Literature 1 describes a method for forming an alignment symbol on a wiring board by pasting a sheet-like member having a non-light reflecting surface or a light diffusing surface to cover a light reflecting surface of a wiring board, and then, forming an opening in the sheet-like member by laser processing to partially expose the light reflecting surface.

A process of pasting the sheet-like member and a process of forming the opening by laser irradiation are required to form the alignment symbol using this method. As a result, it is considered that a manufacturing process becomes complicated and it is difficult to automate the manufacturing process, leading to a decrease in production efficiency and the decrease in the yield.

In addition, this method is not a repair method in a case where there is a defect in the alignment symbol or a symbol peripheral region, it is considered that this method is also applicable to repair of the defect in the symbol peripheral region by pasting the sheet-like member. However, there is no change in the necessity of the opening formation process using laser, and it is considered that it is difficult to suppress a repair cost. In addition, the opening of the sheet-like member defines an outer edge of the alignment symbol, and thus, it is considered that a distortion occurs in the shape of the alignment symbol if the outer edge of the original alignment symbol does not completely match the opening of the sheet-like member when the sheet-like member is applied to the repair of the alignment symbol.

CITATION LIST

Patent Literature

Patent Literature 1: JP 2001-330626 A

SUMMARY OF INVENTION

Technical Problem

The present invention has been made in view of the above circumstances, and an object thereof is to provide an alignment chip configured to form an alignment symbol on a wiring board of a probe card. In particular, an object is to provide an alignment chip configured to repair a defect occurring in an alignment symbol or a peripheral region thereof.

Another object is to provide a probe card in which an alignment symbol is formed on a wiring board using an alignment chip.

A still another object is to provide a probe card repairing method for repairing a probe card in which a defect occurs in an alignment symbol or a peripheral region thereof using an alignment chip.

Solution to Problem

An alignment chip for a probe card according to a first embodiment of the present invention includes: a substrate having a pasting surface to be pasted to a probe installation surface of a wiring board constituting a probe card via an adhesive; and an alignment symbol made of a metal film formed on a symbol surface on a side opposite to the pasting surface of the substrate, and is configured such that the symbol surface includes a symbol peripheral region surrounding the alignment symbol, and the symbol peripheral region has a lower reflectance than the alignment symbol.

Since such a configuration is adopted, the alignment symbol can be easily formed on the wiring board by pasting the alignment chip to a predetermined position on the wiring board. In addition, the wiring board can be easily repaired by pasting the alignment chip to the wiring board having a defect in the alignment symbol or the symbol peripheral region.

The alignment chip for a probe card according to a second embodiment of the present invention is configured such that a resin film is formed in the symbol peripheral region in addition to the above configuration.

In the alignment chip for a probe card according to a third embodiment of the present invention, in addition to the above configuration, the metal film includes a first metal layer to be exposed and a second metal layer formed between the first metal layer and the substrate, and the second metal layer is made of a material having a higher Young's modulus than the first metal layer, and is formed to be thicker than the first metal layer. Since such a configuration is adopted, the strength of the alignment chip can be secured.

The alignment chip for a probe card according to a fourth embodiment of the present invention is configured such that the substrate has a thickness of 450 μm or less in addition to the above configuration.

In the alignment chip for a probe card according to a fifth embodiment of the present invention, the alignment chip is pasted to cover an alignment symbol formed in advance on the probe installation surface in addition to the above configuration.

A probe card according to a sixth embodiment of the present invention includes: a wiring board having a probe installation surface on which a probe electrode pad is formed; a probe attached to the probe electrode pad; and an alignment chip pasted to the probe installation surface, in which the alignment chip includes a substrate having a pasting surface to be pasted to the probe installation surface via an adhesive; and an alignment symbol made of a metal film formed on a symbol surface on a side opposite to the pasting surface of the substrate, the symbol surface includes a symbol peripheral region surrounding the alignment symbol, and the symbol peripheral region has a lower reflectance than the alignment symbol.

A probe card repairing method according to a seventh aspect of the present invention is a probe card repairing method for repairing a probe card, which includes a wiring board having a probe installation surface on which a probe electrode pad configured for attachment of a probe and a first alignment symbol configured to perform position alignment before inspection are formed, and is configured to paste an alignment chip to the probe arrangement surface using an adhesive such that the alignment chip covers the first alignment symbol and a second alignment symbol formed on a symbol surface of the alignment chip on a side opposite to the wiring board is arranged to overlap the first alignment symbol.

Advantageous Effects of Invention

According to the present invention, it is possible to provide the alignment chip for forming the alignment symbol on the wiring board of the probe card. In particular, it is possible to provide the alignment chip for repairing the defect occurring in the alignment symbol or the peripheral region thereof.

In addition, it is possible to provide the probe card in which the alignment symbol is formed on the wiring board using the alignment chip.

Furthermore, it is possible to provide the probe card repairing method for repairing the probe card in which the defect occurs in the alignment symbol or the peripheral region thereof using the alignment chip.

BRIEF DESCRIPTION OF DRAWINGS

FIG. 5 is a view sequentially illustrating an example of a manufacturing process of the alignment chip 5A.

Figure 9:
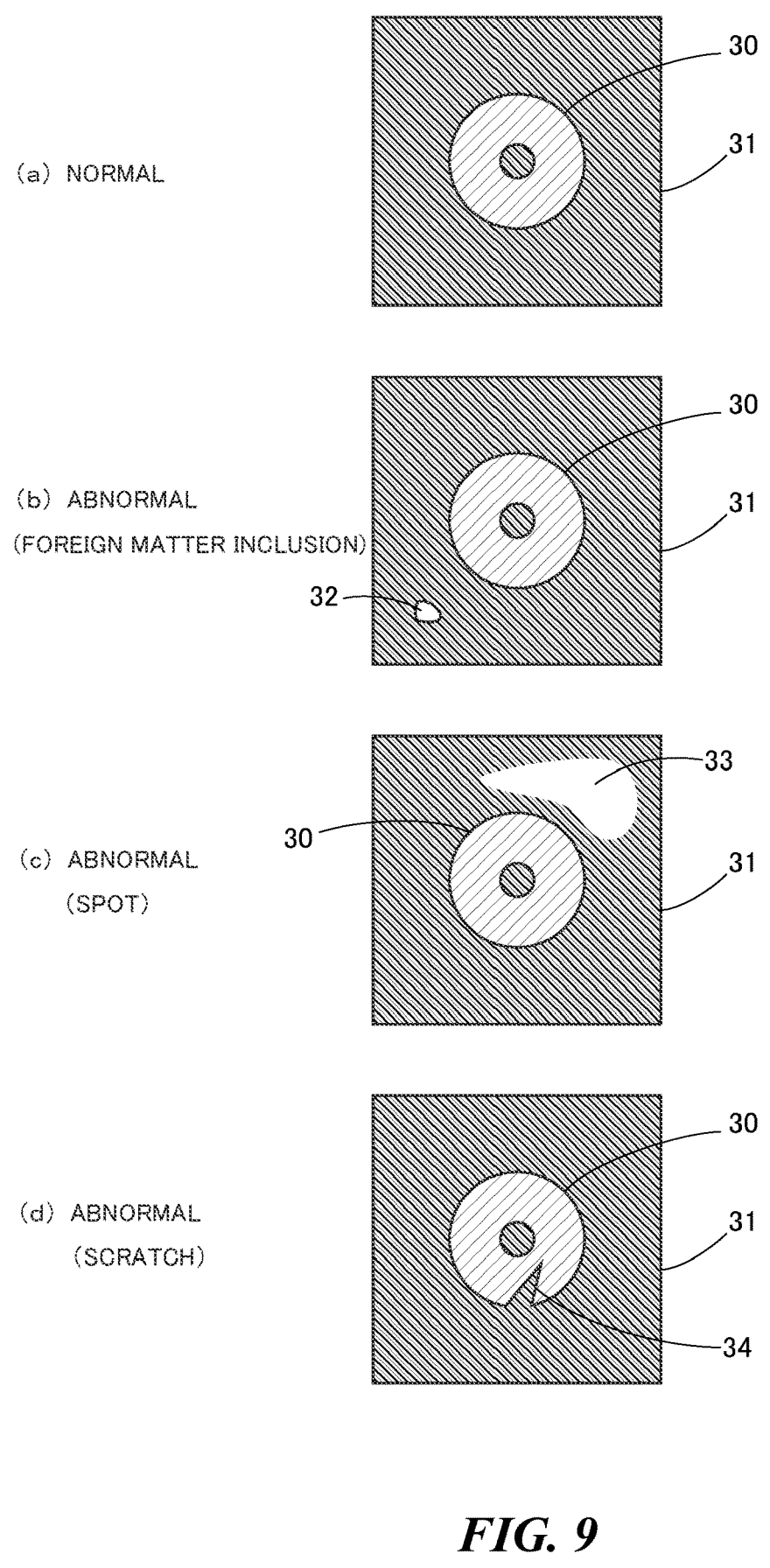

FIG. 9 is a view illustrating various states that may occur in the alignment symbol 30 and the symbol peripheral region 31.

DESCRIPTION OF EMBODIMENTS

First Embodiment (1) Probe Card 10

Figure 1:
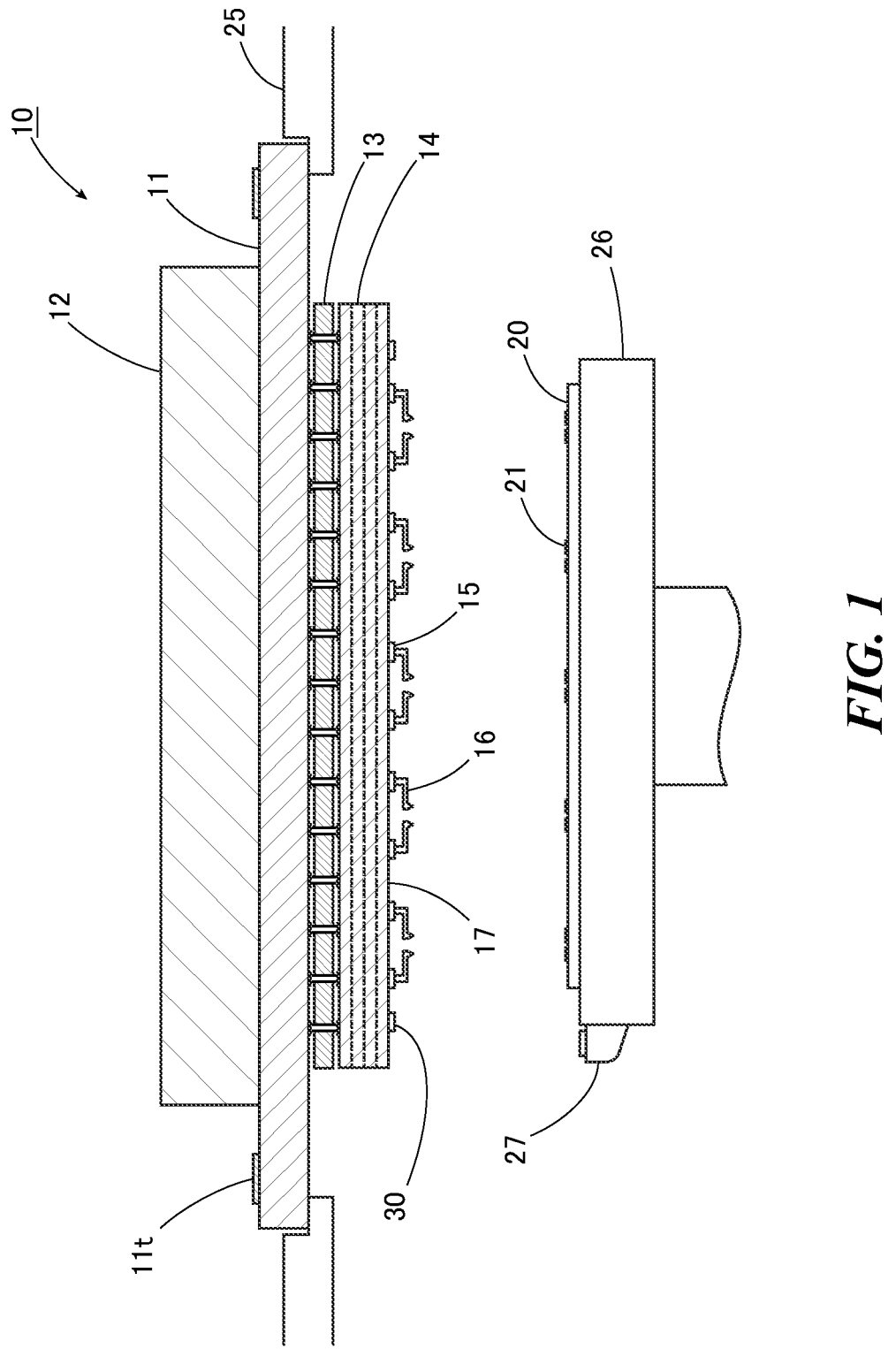
FIG. 1 is a diagram illustrating an example of a schematic configuration of a probe card 10 to which an alignment chip according to a first embodiment of the present invention is applied.

FIG. 1 is a diagram illustrating an example of a schematic configuration of a probe card 10 to which an alignment chip according to a first embodiment of the present invention is applied. The probe card 10 is attached to a wafer prober with a probe installation surface 17 facing downward, opposes an electrode pad 21 of a semiconductor wafer 20 placed on a stage 26, and can bring probes 16 into contact with the electrode pad 21 by moving the stage 26 up and down.

The probe card 10 includes a main board 11, a reinforcing plate 12, an interposer 13, a space transformer (ST) board 14, and two or more probes 16.

The main board 11 is a wiring board detachably attached to the wafer prober, and for example, a disk-shaped glass epoxy substrate is used. The main board 11 is supported by a card holder 25 of the wafer prober at an outer peripheral edge portion of a lower surface and is arranged substantially horizontally. The reinforcing plate 12 configured to suppress a distortion of the main board 11 is attached at a central portion of an upper surface of the main board 11, and two or more external terminals 11t to which signal terminals of a tester device (not illustrated) are connected are provided at an outer peripheral edge portion of the upper surface.

The interposer 13 is a means for connection between boards arranged between the main board 11 and the ST board 14 and causing a current to flow between a wiring of the main board 11 and a wiring of the ST board 14, and includes, for example, a large number of pogo pins.

The ST board 14 is a multilayer wiring board that converts an electrode pitch, for example, a laminate substrate obtained by pasting two or more ceramic plates to each other. The ST board 14 is arranged on the lower surface side of main board 11 with the interposer 13 interposed therebetween. The probe installation surface 17 is a lower surface of the ST board 14, and a large number of probe electrode pads 15 and four alignment symbols 30 are formed thereon. The probe electrode pad 15 and the alignment symbol 30 are metal films formed on the probe installation surface 17 by photolithography processing using an electroplating method or an etching method. The probe electrode pad 15 is an electrode to which the probes are connected, and is formed so as to correspond to the electrode pad 21 on the semiconductor wafer 20.

The stage 26 is a placement table of the semiconductor wafer 20, and can move and rotate in a horizontal plane and move in a vertical direction. A camera 27 is an imaging means for capturing images of the alignment symbols 30, detects positions of the alignment symbols 30 by capturing the images while moving the stage 26, and performs position alignment of the semiconductor wafer 20 with the probe card 10.

When there is a defect in the alignment symbol 30 or a peripheral region thereof and the alignment symbol 30 cannot be extracted from the captured image, a repair is performed using an alignment chip to be described later. The repair is performed on one or two or more alignment symbols 30 in which the defect occurs among the four alignment symbols 30, and is not performed on the other alignment symbols 30 in which no defect occurs.

(2) Alignment Chip 5A

Figure 2:
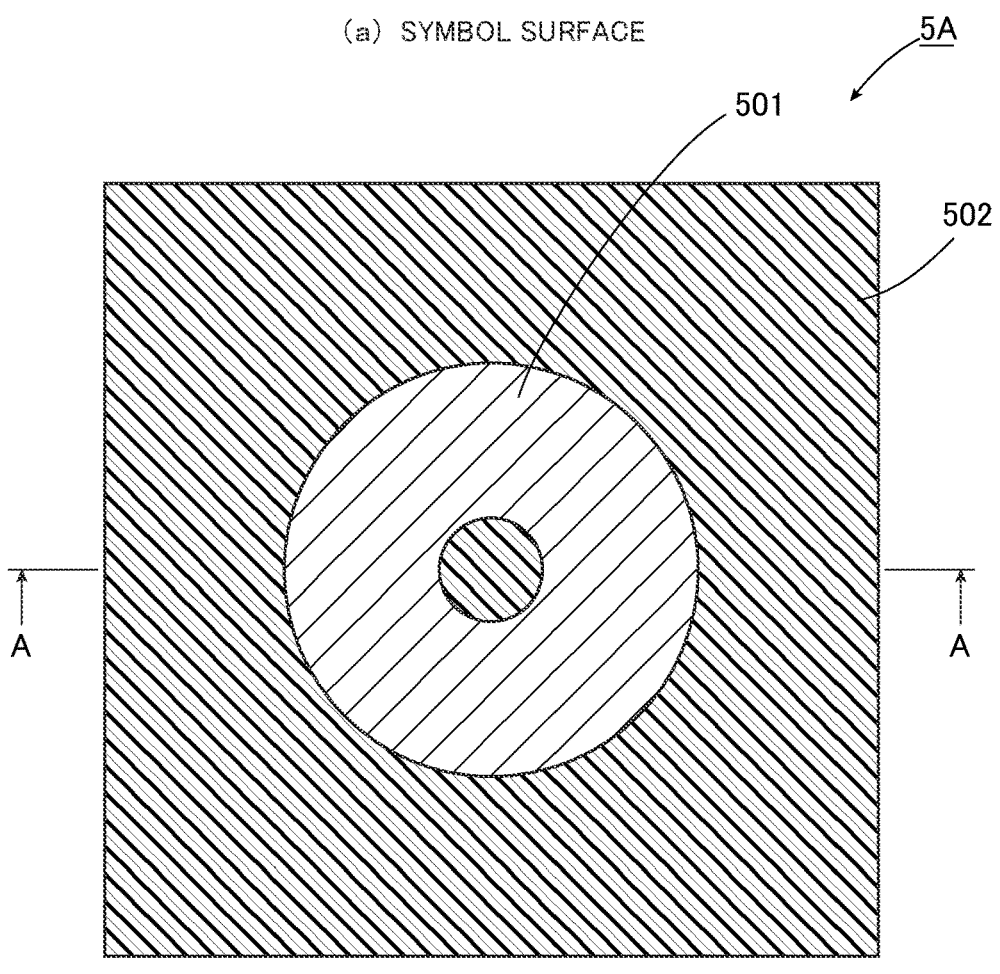
FIG. 2 is a view illustrating a configuration example of an alignment chip 5A.
Figure 2:
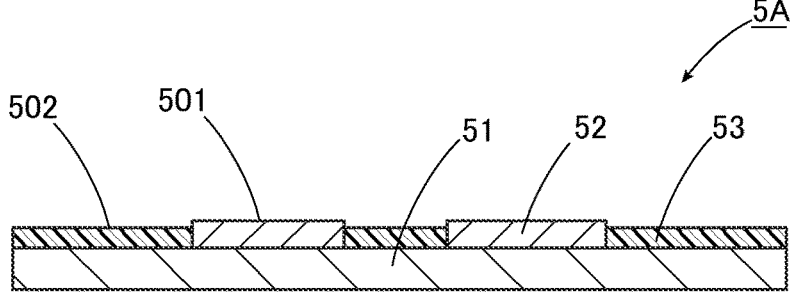

FIG. 2 is a view illustrating a configuration example of an alignment chip 5A, in which (a) is a view in which a symbol surface is viewed in a plan view, and (b) is a cross-sectional view (A-A cross-sectional view) illustrating a state at the time of being cut along a cutting line A-A.

The alignment chip 5A is a repair member configured to repair the probe card 10, and has the symbol surface on which an alignment symbol 501 is formed and a pasting surface which is a surface on a side opposite to the symbol surface and is to be pasted to the ST board 14. The symbol surface is divided into the alignment symbol 501 which is a high-reflectance region and a symbol peripheral region 502 which is a low-reflectance region.

The alignment symbol 501 is made of a metal material having a high reflectance, and is a thin film having a planar shape of a predetermined geometric figure, for example, an Au film having an annular shape. The planar shape of the alignment symbol 501 is desirably the same as that of the original alignment symbol 30 formed on the ST board 14, and the metal materials and surface states of the two are also desirably the same.

The alignment symbol 501 is made of a metal material having a high reflectance, and is a thin film having a planar shape of a predetermined geometric figure, for example, an Au film having an annular shape. The planar shape of the alignment symbol 501 is desirably the same as that of the original alignment symbol 30 formed on the ST board 14, and the metal materials and surface states of the two are also desirably the same.

The symbol peripheral region 502 is made of a resin material having a low reflectance, and is a thin film formed in a region other than the alignment symbol 501, for example, a polyimide film. The symbol peripheral region 502 is a region surrounding at least the alignment symbol 501, and is also formed in a hollow region when the alignment symbol 501 has the hollow region as in the case of the annular shape.

As illustrated in FIG. 2(b), the alignment chip 5A includes a substrate 51 made of ceramic or silicon, a metal film 52 corresponding to the alignment symbol 501 formed on the substrate 51, and a resin film 53 corresponding to the symbol peripheral region 502 formed on the substrate 51. The metal film 52 can include one or two or more metal layers, and the resin film 53 can also include one or two or more resin layers.

The alignment chip 5A needs to have such a thickness as not to come into contact with a semiconductor chip wafer at the time of inspection. At the time of inspection, overdrive is performed such that the semiconductor wafer 20 is brought close to the probe 16 and is further brought close to elastically deform the probes 16 after reaching a position where tips of the probes 16 start to come into contact with the electrode pad 21 of the semiconductor wafer 20. For this reason, it is necessary to prevent the alignment chip 5A pasted to the probe installation surface from exceeding a height of the probe 16 elastically deformed by the overdrive. For example, the thickness of the alignment chip is desirably 500 μm or less, and it is desirable to set a thickness of the substrate 51 to 450 μm or less and to set film thicknesses of the metal film 52 and the resin film 53 to 50 μm or less.

(3) Probe Repairing Method

Figure 3:
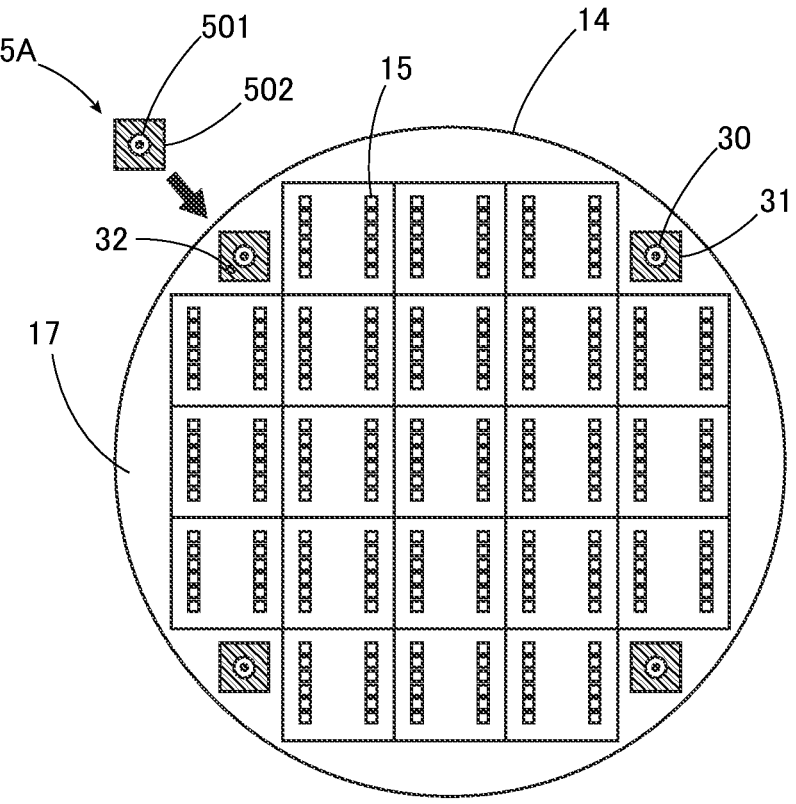
FIG. 3 illustrates an outline of the probe card repairing method.
Figure 4:
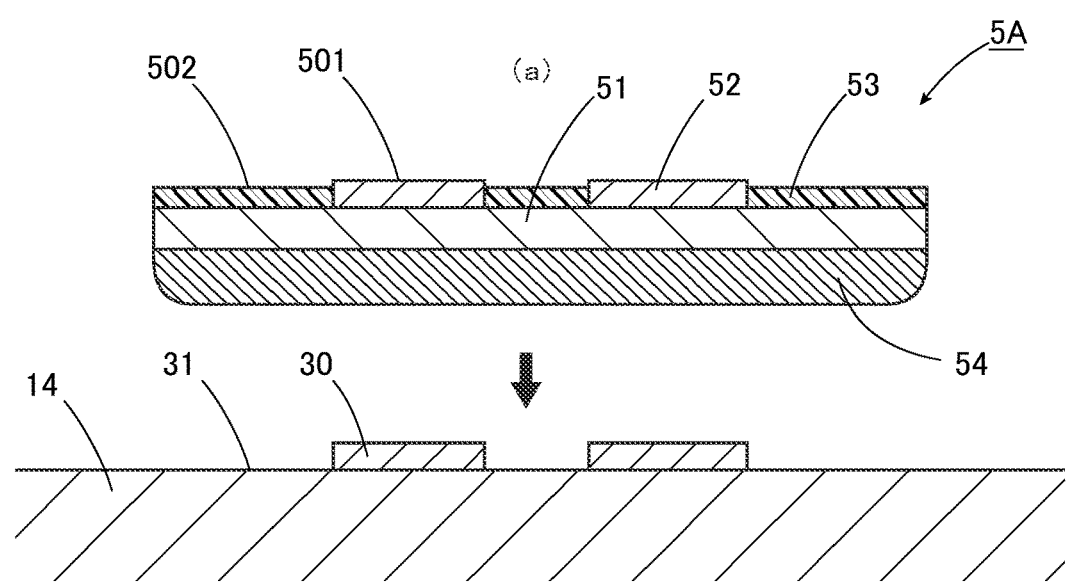
FIG. 4 illustrates an example of the probe card repairing method using the alignment chip 5A.
Figure 4:
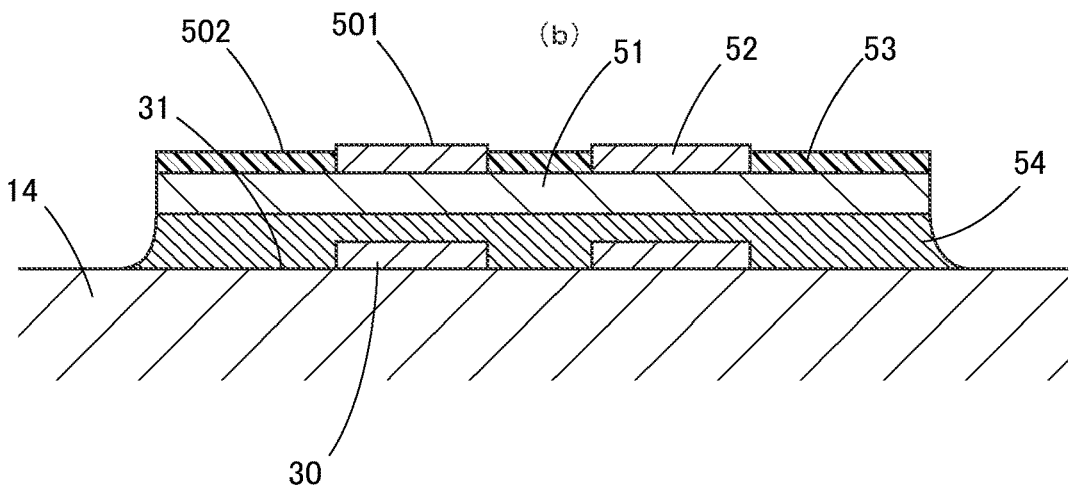

FIGS. 3 and 4 are views illustrating an example of a probe card repairing method using the alignment chip 5A.

FIG. 3 illustrates an outline of the probe card repairing method. In the illustrated ST board 14, a defect in which foreign matter 32 having a high reflectance adheres to one of the symbol peripheral regions 31 occurs. For this reason, the ST board 14 is repaired by pasting the alignment chip 5A. The ST board 14 to be repaired is preferably in a state before attachment of the probes 16, but may be in a state after attachment of the probes 16.

FIG. 4 is cross-sectional views at the time of being cut perpendicularly to the alignment chip 5A, in which (a) is a cross-sectional view before a repair and (b) is a cross-sectional view after the repair. The alignment chip 5A is pasted onto the probe installation surface of the ST board 14 via an adhesive 54, and covers the alignment symbol 30 and the symbol peripheral region 31 in which the defect occurs.

The adhesive 54 is applied to the pasting surface of the alignment chip 5A, and then, the alignment chip 5A is pasted to a predetermined position on the ST board 14 while performing accurate position alignment with respect to the ST board 14.

The alignment chip 5A is pasted such that the alignment symbol 501 matches the original alignment symbol 30 on the ST board 14. However, the original alignment symbol 30 is hidden by the alignment chip 5A to be pasted at the time of pasting. For this reason, a target mark of a microscope is aligned with a pasting position of the alignment chip 5A on the ST board 14, and work of pasting the alignment chip 5A is performed while looking through an eyepiece of the microscope.

The position alignment of the alignment chip 5A is performed using, for example, a stage to which a micrometer in XY directions is attached and HISOMET (a non-contact depth measuring microscope of an optical type focal point detection system). The ST board 14 placed on the stage is observed with the HISOMET and the target mark is made to match the tip of the probe 16. Thereafter, the micrometer is operated to move the stage by a predetermined distance in each of the XY directions from the tip of the probe 16, thereby obtaining a state in which the target mark indicates the pasting position of the alignment chip 5A. In this state, the work of pasting the alignment chip 5A is performed while looking through the eyepiece lens of the HISOMET.

Here, a method in which the adhesive 54 is applied to the pasting surface of the alignment chip 5A has been described, but the adhesive 54 can also be applied to the pasting position of the alignment chip 5A on the ST board 14. In addition, the adhesive 54 can also be applied to both of them.

(4) Method for Manufacturing Alignment Chip 5A

Figure 5:
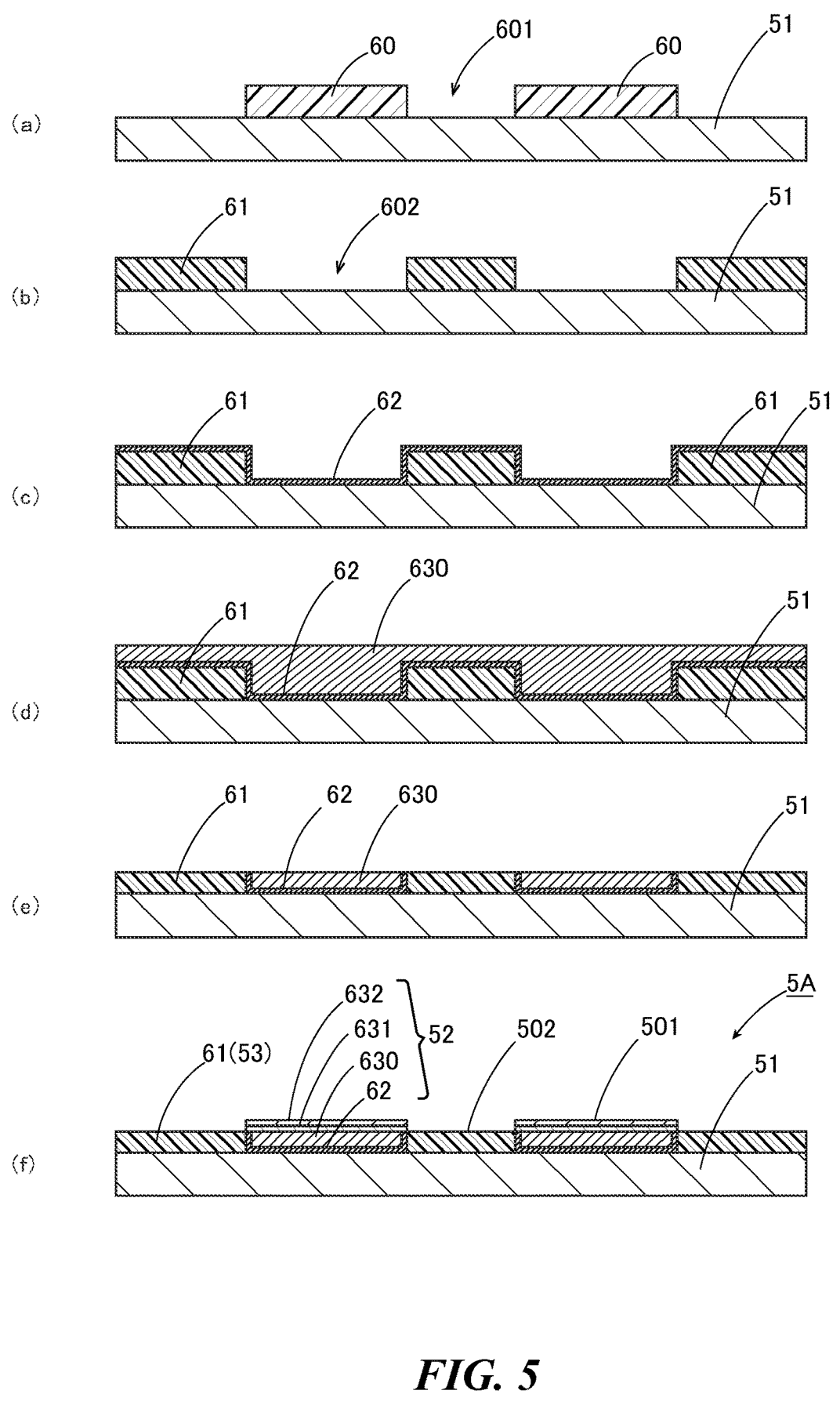

In FIG. 5, (a) to (f) are views sequentially illustrating an example of a manufacturing process of the alignment chip 5A.

FIG. 5(*a*) illustrates a state in which a photoresist 60 is selectively formed on the substrate 51. After the photoresist 60 is formed on the entire surface of the substrate 51, selective exposure and development are performed to leave only a region corresponding to the alignment symbol 501, and an opening 601 for exposing the substrate 51 is formed in a region corresponding to the symbol peripheral region 502.

FIG. 5(*b*) illustrates a state in which a resin layer 61 is selectively formed on the substrate 51. The resin layer 61 is formed on the substrate 51 on which the photoresist 60 has been selectively formed, and the photoresist 60 is removed, so that the resin layer 61 is left only in the region corresponding to the symbol peripheral region 502, and an opening 602 for exposing the substrate 51 is formed in the region corresponding to the alignment symbol 501.

FIG. 5(*c*) illustrates a state in which a seed layer 62 is formed on the entire surface of the substrate 51. The seed layer 62 is a thin metal layer formed by sputtering.

FIG. 5(*d*) illustrates a state in which a first metal layer 630 is formed on the entire surface of the substrate 51 by an electroplating method. The first metal layer 630 is made of a metal material having a relatively high Young's modulus, for example, copper (Cu) or a nickel-cobalt alloy (NiCo).

FIG. 5(*e*) illustrates a state in which the entire surface of the substrate 51 on which the first metal layer 630 has been formed is polished. The surface of the substrate 51 is planarized by a polishing treatment. This polishing treatment is performed until the resin layer 61 is exposed, and the first metal layer 630 is removed from the region corresponding to the symbol peripheral region 502 and exposed in the region corresponding to the alignment symbol 501.

FIG. 5(*f*) illustrates a state in which a second metal layer 631 and a third metal layer 632 are sequentially formed in the region corresponding to the alignment symbol 501. The second metal layer 631 and the third metal layer 632 are formed by an electroplating method. The exposed third metal layer 632 is made of a metal material having a high reflectance, for example, gold (Au).

The seed layer 62 and the first to third metal layers 630 to 632 constitute the metal film 52. The first metal layer 630 is made of the metal material having a higher Young's modulus than the third metal layer 632, and is formed as a layer thicker than the third metal layer 632. For this reason, the mechanical strength of the alignment chip 5A can be secured as compared with a case where the metal film 52 is made of only the metal material of the third metal layer 632, for example.

The alignment chip 5A can be formed by performing a photolithography processing on the substrate 51. For this reason, the alignment chip 5A can be easily manufactured using existing manufacturing techniques. In addition, a large number of the alignment chips 5A can be simultaneously formed on the same substrate 51 and then separated into the individual alignment chips 5A by dicing. For this reason, the alignment chips 5A can be manufactured at a low cost. In addition, it is unnecessary to perform laser processing as in the case of the conventional technique after the pasting to the ST board 14, and the wiring board can be easily and inexpensively repaired.

Second Embodiment

In the present embodiment, an example of an alignment chip 5B in which a shape of the alignment symbol 501 is different and for which a different manufacturing method is used will be described as another example of the alignment chip 5A. In the present embodiment, differences from the alignment chip 5A will be mainly described, and redundant description will be omitted.

(5) Alignment Chip 5B

Figure 6:
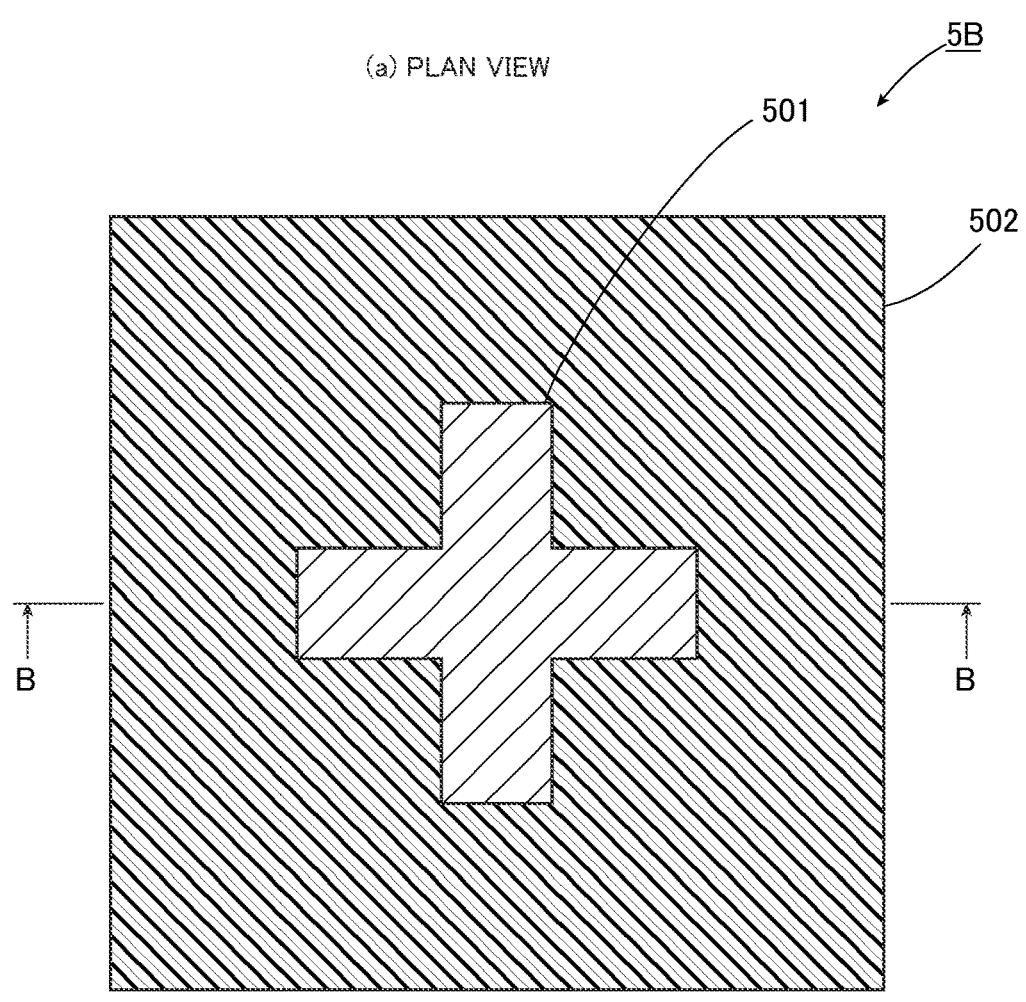
FIG. 6 is a view illustrating a configuration example of the alignment chip 5B according to a second embodiment of the present invention.
Figure 6:
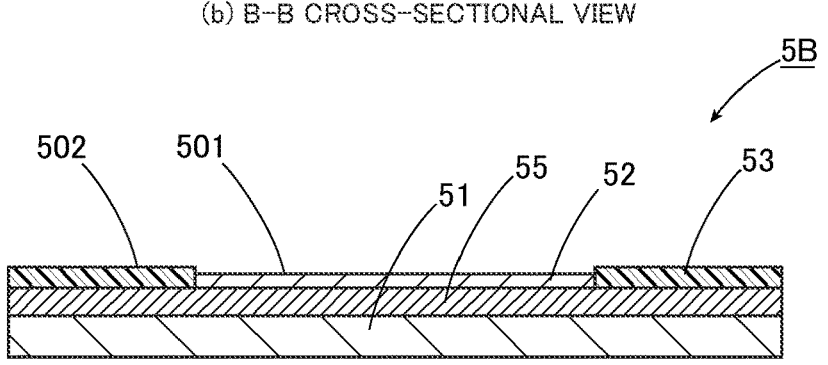

FIG. 6 is a view illustrating a configuration example of the alignment chip 5B according to a second embodiment, in which (a) is a view in which a symbol surface is viewed in a plan view, and (b) is a cross-sectional view (B-B cross-sectional view) illustrating a state at the time of being cut along a cutting line B-B.

As illustrated in FIG. 6(*a*), the alignment symbol 501 has a cross-shaped planar shape including two rectangles orthogonal to each other.

As illustrated in FIG. 6(*b*), the alignment chip 5A includes the ceramic or silicon substrate 51, a base metal film 55 formed on the substrate 51, and the metal film 52 and the resin film 53 formed on the base metal film 55. The base metal film 55 can include one or more metal layers.

(4) Method for Manufacturing Alignment Chip 5B

Figure 7:
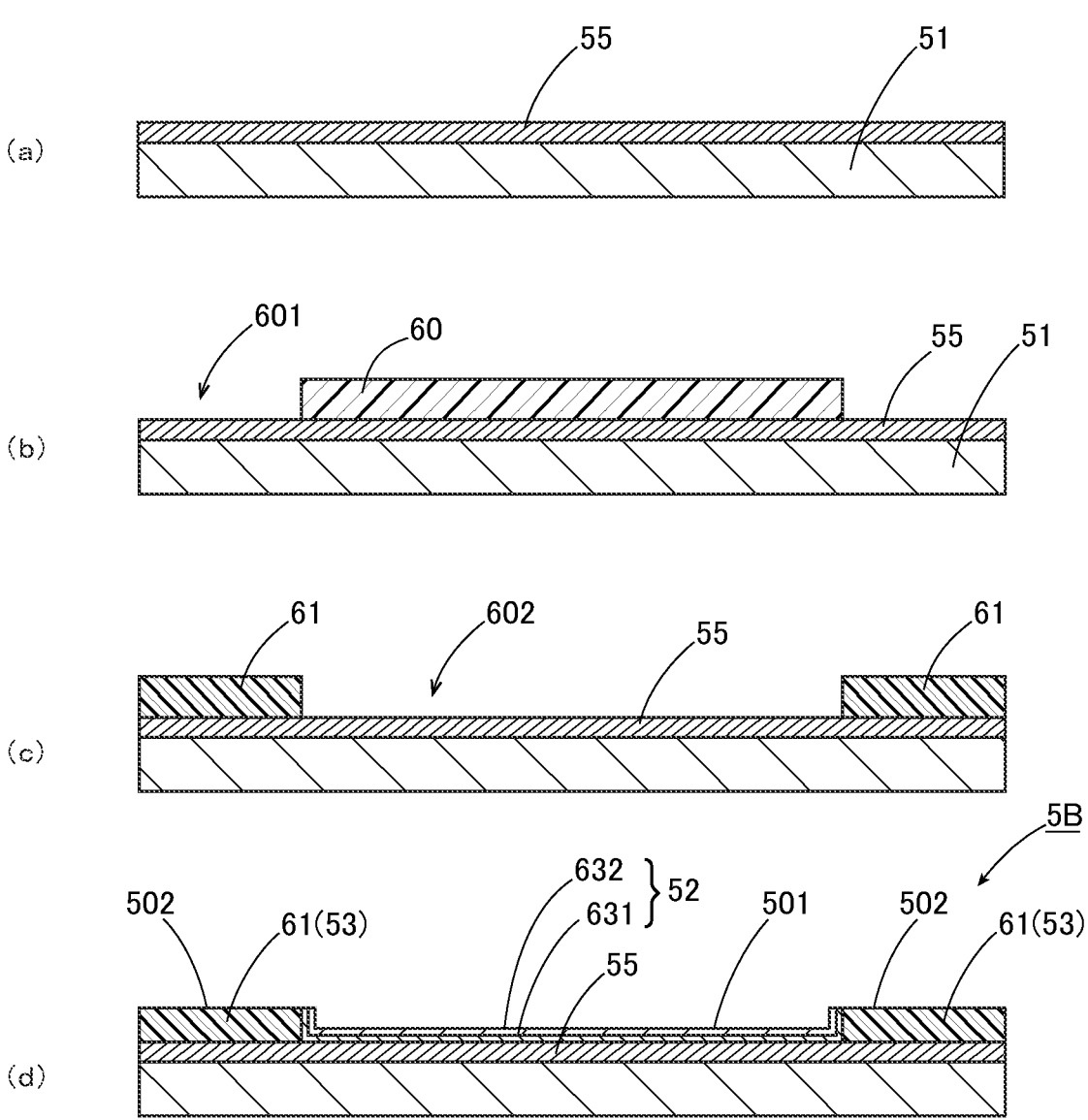
FIG. 7 is a view sequentially illustrating an example of a manufacturing process of the alignment chip 5B.
Figure 8:
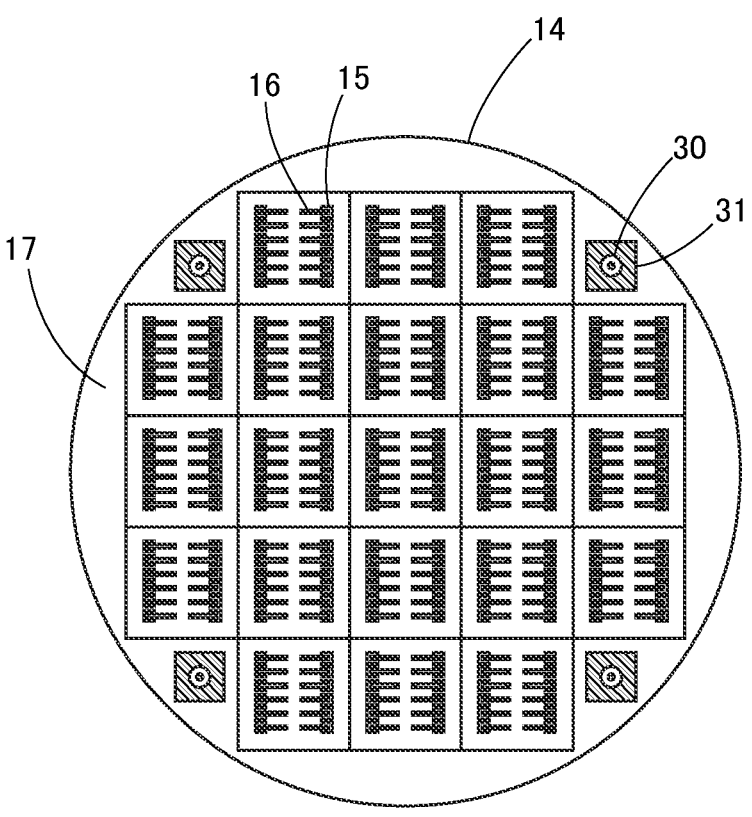
FIG. 8 is a view illustrating an example of a wiring board constituting a conventional probe card.

In FIG. 7, (a) to (d) are views sequentially illustrating an example of a manufacturing process of the alignment chip 5B.

FIG. 7(*a*) illustrates a state in which the base metal film 55 is formed on the entire surface of the substrate 51. The base metal film 55 is made of a metal material having a relatively high Young's modulus, for example, copper (Cu).

FIG. 7(*b*) illustrates a state in which the photoresist 60 is selectively formed on the base metal film 55. After the photoresist 60 is formed on the entire surface of the substrate 51, selective exposure and development are performed to leave only a region corresponding to the alignment symbol 501, and the opening 601 for exposing the base metal film 55 is formed in a region corresponding to the symbol peripheral region 502.

FIG. 7(c) illustrates a state in which the resin layer 61 is selectively formed on the base metal film 55. The resin layer 61 is formed on the substrate 51 on which the photoresist 60 has been selectively formed, and the photoresist 60 is removed, so that the resin layer 61 is left only in the region corresponding to the symbol peripheral region 502, and the opening 602 for exposing the base metal film 55 is formed in the region corresponding to the alignment symbol 501.

FIG. 7(d) illustrates a state in which the second metal layer 631 and the third metal layer 632 are sequentially formed in the region corresponding to the alignment symbol 501. The second metal layer 631 and the third metal layer 632 are formed by an electroplating method. The exposed third metal layer 632 is made of a metal material having a high reflectance, for example, gold (Au).

The second and third metal layers 631 and 632 constitute the metal film 52. The base metal film 55 is made of the metal material having a higher Young's modulus than the third metal layer 632, and is formed as a layer thicker than the third metal layer 632. The alignment symbol 501 includes the metal film 52 and a part of the base metal film 55 overlapping the metal film 52, and the mechanical strength of the alignment chip 5B can be secured as compared with a case where the metal film constituting the alignment symbol 501 includes only the metal material of the third metal layer 632, for example.

Although the examples in which the shape of the alignment symbol 501 is the annular shape and the cross shape have been described in the above embodiments, the present invention is not limited to such cases. Any shape can be adopted as the reception of the alignment symbol 501.

In addition, the example in which the alignment chip 5A or 5B is pasted to repair a defect when the defect occurs in the alignment symbol 30 or the symbol peripheral region 31 formed on the ST board 14 has been described in the above embodiments, but the present invention is not limited to such a case. For example, the alignment chip 5A or 5B can also be pasted to the ST board 14 on which the alignment symbol 30 is not formed, thereby additionally forming the alignment symbol 501 after manufacture of the ST board 14. Furthermore, the alignment chip 5A or 5B on which the alignment symbol 30 having a different shape is formed can also be pasted onto the ST board 14 on which the alignment symbol 501 is formed, thereby changing the shape of the alignment symbol after manufacture of the ST board 14.

The alignment chip 5A or 5B is desirably pasted to the ST board 14 before attachment of the probe 16, but can also be pasted to the ST board 14 after attachment of the probe 16. In addition, the alignment chip 5A or 5B desirably covers the original alignment symbol 30 completely, but does not necessarily cover the original symbol peripheral region 31 completely.

DESCRIPTION OF REFERENCE NUMERALS

10 probe card
11 main board
13 interposer
14 ST board (wiring board)
15 probe electrode pad
16 probe
17 probe installation surface
20 semiconductor wafer

21 electrode pad
30 alignment symbol
31 symbol peripheral region
5A,5B alignment chip
501 alignment symbol
502 symbol peripheral region
51 substrate
52 metal film
53 resin film
54 adhesive
55 base metal film
60 photoresist
601,602 opening
61 resin layer
62 seed layer

The invention claimed is:

1. A chip to be pasted to a surface of a wiring board of a probe card, comprising:
   a chip-shaped base member;
   a metal member formed directly on a portion of a surface of the chip-shaped base member, the metal member having a planar shape corresponding to a symbol for alignment of the probe card; and
   a resin member formed directly on a remaining portion of a same layer as the metal member on the surface of the chip-shaped base member, the resin member having a lower reflectance than the metal member, wherein
   a back surface of the chip-shaped base member is to be pasted to the surface of the wiring board of the probe card.

2. The chip according to claim 1, wherein
   the metal member includes a first metal layer to be exposed and a second metal layer formed between the first metal layer and the surface of the chip-shaped base member, and
   the second metal layer is made of a material having a higher Young's modulus than the first metal layer, and is formed to be thicker than the first metal layer.

3. The chip according to claim 2, wherein the back surface of the chip-shaped base member is to be pasted to the surface of the wiring board of the probe card such that the back surface covers an alignment symbol on the wiring board.

4. The chip according to claim 1, wherein the chip has a thickness of 450 μm or less.

5. The chip according to claim 4, wherein the back surface of the chip-shaped base member is to be pasted to the surface of the wiring board of the probe card such that the back surface covers an alignment symbol on the wiring board.

6. The chip according to claim 1, wherein the back surface of the chip-shaped base member is to be pasted to the surface of the wiring board of the probe card such that the back surface covers an alignment symbol on the wiring board.

7. A method for repairing a probe card, which includes a wiring board having a surface on which an electrode pad configured for attachment of a probe and a first alignment symbol configured to perform position alignment before inspection are formed, the method comprising pasting the chip according to claim 1 to the surface of the wiring board using an adhesive such that the chip covers the first alignment symbol and a second alignment symbol formed by the metal member formed on the surface of the chip is arranged to overlap the first alignment symbol.

8. A probe card, comprising:
   a wiring board having a surface on which an electrode pad is formed;
   a probe attached to the electrode pad; and
   a chip pasted to the surface of the wiring board, wherein the chip includes a chip-shaped base member and a metal member formed directly on a portion of a surface of the chip-shaped base member, the metal member having a planar shape corresponding to a symbol for alignment of the probe card, and a resin member formed directly on a remaining portion of a same layer as the metal member on the surface of the chip-shaped base member, the resin member having a lower reflectance than the metal member.

\* \* \* \* \*